(12) United States Patent
Basu et al.

(10) Patent No.: US 10,096,711 B2
(45) Date of Patent: *Oct. 9, 2018

(54) SILICON-CONTAINING, TUNNELING FIELD-EFFECT TRANSISTOR INCLUDING III-N SOURCE

(71) Applicant: International Business Machines Corporation, Armonk, NY (US)

(72) Inventors: Anirban Basu, Elmsford, NY (US); Bahman Hekmatshoartabari, White Plains, NY (US); Davood Shahrjerdi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 11 days.

This patent is subject to a terminal disclaimer.

(21) Appl. No.: 15/694,981

(22) Filed: Sep. 4, 2017

(65) Prior Publication Data

US 2017/0365717 A1    Dec. 21, 2017

Related U.S. Application Data

(63) Continuation of application No. 15/230,797, filed on Aug. 8, 2016, now Pat. No. 9,773,909, which is a continuation of application No. 14/311,401, filed on Jun. 23, 2014, now Pat. No. 9,425,312.

(51) Int. Cl.
*H01L 29/78* (2006.01)
*H01L 29/04* (2006.01)
(Continued)

(52) U.S. Cl.
CPC ...... *H01L 29/7848* (2013.01); *H01L 21/0243* (2013.01); *H01L 21/0254* (2013.01);
(Continued)

(58) Field of Classification Search
CPC ............. H01L 21/02381; H01L 21/308; H01L 21/26586; H01L 21/30604;
(Continued)

(56) References Cited

U.S. PATENT DOCUMENTS

| 5,879,996 A | 3/1999 | Forbes |
| 7,592,213 B2 | 9/2009 | Datta |

(Continued)

FOREIGN PATENT DOCUMENTS

JP    2010219384 A    9/2010

OTHER PUBLICATIONS

Chung, Theodore et al., Growth of InGaN HBTs by MOCVD, Journal of Electronic Materials, vol. 35, No. 1, 2006, pp. 695-700.
(Continued)

*Primary Examiner* — Caridad Everhart
(74) *Attorney, Agent, or Firm* — L. Jeffrey Kelly, Esq.; Otterstedt, Ellenbogen & Kammer, LLP

(57) ABSTRACT

Tunneling field-effect transistors including silicon, germanium or silicon germanium channels and III-N source regions are provided for low power operations. A broken-band heterojunction is formed by the source and channel regions of the transistors. Fabrication methods include selective anisotropic wet-etching of a silicon substrate followed by epitaxial deposition of III-N material and/or germanium implantation of the substrate followed by the epitaxial deposition of the III-N material.

13 Claims, 3 Drawing Sheets

(51) Int. Cl.

| | |
|---|---|
| *H01L 29/66* | (2006.01) |
| *H01L 29/739* | (2006.01) |
| *H01L 29/267* | (2006.01) |
| *H01L 21/02* | (2006.01) |
| *H01L 29/08* | (2006.01) |
| *H01L 29/06* | (2006.01) |
| *H01L 21/308* | (2006.01) |
| *H01L 21/265* | (2006.01) |
| *H01L 21/28* | (2006.01) |
| *H01L 29/10* | (2006.01) |
| *H01L 21/306* | (2006.01) |

(52) U.S. Cl.
CPC .. *H01L 21/02381* (2013.01); *H01L 21/02433* (2013.01); *H01L 21/02576* (2013.01); *H01L 21/26506* (2013.01); *H01L 21/26586* (2013.01); *H01L 21/28255* (2013.01); *H01L 21/308* (2013.01); *H01L 21/3085* (2013.01); *H01L 21/30604* (2013.01); *H01L 29/04* (2013.01); *H01L 29/045* (2013.01); *H01L 29/0657* (2013.01); *H01L 29/0847* (2013.01); *H01L 29/1033* (2013.01); *H01L 29/1041* (2013.01); *H01L 29/267* (2013.01); *H01L 29/66477* (2013.01); *H01L 29/66977* (2013.01); *H01L 29/7391* (2013.01); *H01L 21/30608* (2013.01)

(58) Field of Classification Search
CPC ......... H01L 21/30608; H01L 21/02433; H01L 21/0243; H01L 21/3085; H01L 21/28255; H01L 29/7848; H01L 29/045; H01L 29/0847; H01L 29/1041; H01L 29/66477; H01L 29/04; H01L 29/0657; H01L 29/267

See application file for complete search history.

(56) References Cited

U.S. PATENT DOCUMENTS

| | | | |
|---|---|---|---|
| 8,044,409 B2 | 10/2011 | Yu | |
| 8,294,137 B2 * | 10/2012 | Jain | B82Y 10/00 257/20 |
| 8,309,988 B2 | 11/2012 | Niiyama | |
| 8,373,204 B2 | 2/2013 | Cheng | |
| 8,519,438 B2 | 8/2013 | Mishra | |
| 9,425,312 B2 | 8/2016 | Basu et al. | |
| 9,773,909 B2 * | 9/2017 | Basu | H01L 29/7848 |
| 2002/0076871 A1 | 6/2002 | Yanagawa et al. | |
| 2007/0155063 A1 | 7/2007 | Datta et al. | |
| 2010/0163845 A1 | 7/2010 | Goel et al. | |
| 2011/0049568 A1 | 3/2011 | Lochtefeld et al. | |
| 2011/0266513 A1 | 11/2011 | Williams et al. | |
| 2012/0068157 A1 * | 3/2012 | Kub | B82Y 10/00 257/15 |
| 2012/0187376 A1 | 7/2012 | Tomioka | |
| 2013/0092958 A1 | 4/2013 | Chen | |
| 2013/0093497 A1 * | 4/2013 | Lee | H01L 29/78609 327/420 |
| 2013/0105763 A1 * | 5/2013 | Yin | H01L 29/66462 257/24 |
| 2013/0221366 A1 | 8/2013 | Curatola | |
| 2013/0292698 A1 | 11/2013 | Then et al. | |
| 2014/0015009 A1 | 1/2014 | Le Royer et al. | |
| 2014/0061647 A1 * | 3/2014 | Werner | H01L 29/66431 257/51 |
| 2014/0103359 A1 | 4/2014 | Shim et al. | |
| 2015/0200288 A1 * | 7/2015 | Zhang | H01L 29/7391 257/12 |
| 2015/0372141 A1 | 12/2015 | Basu et al. | |
| 2016/0181424 A1 * | 6/2016 | Rios | H01L 29/0847 257/192 |
| 2016/0268401 A1 * | 9/2016 | Aleksov | H01L 29/267 |
| 2016/0343860 A1 | 11/2016 | Basu et al. | |

OTHER PUBLICATIONS

Reichertz, Lothar A. et al, Demonstration of a III-Nitride/Silicon Tandem Solar Cell, Applied Physics Express 2 (2009), pp. 122202-1 to 122202-3, The Japan Society of Applied Physics.

Koswatta, Siyruanga O. et al., On the Possibility of Obtaining MOSFET-Like Performance and Sub-60-mV/dec Swing in 1-D Broken-Gap Tunnel Transistors, IEEE Transactions on Electron Devices, vol. 57, No. 12, Dec. 2010, pp. 3222-3230.

List of IBM Patents or Patent Applications Treated as Related.

* cited by examiner

TFET is ON

TFET is OFF

SILICON-CONTAINING, TUNNELING FIELD-EFFECT TRANSISTOR INCLUDING III-N SOURCE

CROSS-REFERENCE TO RELATED APPLICATION

This application is a continuation of U.S. patent application Ser. No. 15/230,797 filed Aug. 8, 2016, which is a continuation of U.S. patent application Ser. No. 14/311,401 filed Jun. 23, 2014, now U.S. Pat. No. 9,425,312 the complete disclosures of which are expressly incorporated herein by reference in their entireties for all purposes.

FIELD

The present disclosure relates to tunneling field-effect transistors and the fabrication of tunneling field-effect transistors.

BACKGROUND

Field-effect transistors include source, drain and gate structures. A biasing voltage applied across gate and source terminals allows the flow of charge carriers, namely electrons or holes, between source and drain. Tunneling field-effect transistors (TFETs) are characterized by oppositely doped source and drain regions. Band-to-band tunneling is caused upon application of a sufficient gate bias. TFET structures including strained Ge/SiGe heterojunctions on silicon as well as those based on group III-V materials have been disclosed.

Tunneling field-effect transistors are of interest for low-power operations due to their potential to achieve a sub-60 mV/decade subthreshold slope. A broken-gap heterojunction source is employed to achieve such a steep subthreshold slope in some TFETs.

BRIEF SUMMARY

In accordance with the principles discussed herein, tunneling field-effect transistors and methods relating to such transistors are provided.

A tunneling field-effect transistor is disclosed that includes a source region comprised of an epitaxial n-type III-N material, a p-type drain region, and a p-type $Si_xGe_{1-x}$ channel region operatively associated with the source and drain regions, wherein x is between 0 and 1. The n-type, III-N material has an electron affinity larger than the hole affinity of the channel region and a broken-band heterojunction is formed by the source and channel regions. The transistor further includes a gate electrode and a gate dielectric layer between the gate electrode and the channel region.

A method of fabricating a tunneling field-effect transistor is provided that includes obtaining a crystalline $Si_xGe_1$ substrate, wherein x is between 0 and 1, the crystalline $Si_xGe_{1-x}$ substrate having a top surface and a mask adjoining the top surface. The mask is patterned to form one or more openings within the mask. One or more recesses are anisotropically etched within the top surface of the substrate. The recesses are aligned with the openings in the mask. A III-N source region having n-type conductivity is grown epitaxially on the substrate within the one or more recesses. The mask is removed. A channel region having p-type conductivity is formed from the substrate, a broken-band heterojunction being formed between the source region and the channel region. A drain region having p-type conductivity and operatively associated with the channel region is formed. The method further includes forming a gate dielectric layer on the substrate and adjoining the channel region and forming a gate electrode over the gate dielectric layer.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Substantial beneficial technical effects are provided by the exemplary structures and methods disclosed herein. For example, one or more embodiments may provide one or more of the following advantages:

Lower power consumption of TFET compared to conventional MOSFET devices;
Broken gap heterojunction provides high electron mobility;
Lower subthreshold slope (lower than 60 mV/decade) than theoretical limit of conventional MOSFET devices;
Faster turn off compared to conventional MOSFETs.

These and other features and advantages of the disclosed methods and structures will become apparent from the following detailed description of illustrative embodiments thereof, which is to be read in connection with the accompanying drawings.

DETAILED DESCRIPTION

Tunneling field-effect transistors (TFETs) are disclosed that include crystalline silicon and/or germanium-containing channels and III-N source regions. The electron affinity of the III-N material comprising the source regions of such transistors is greater than the hole affinity of the channel material.

Figure 1:
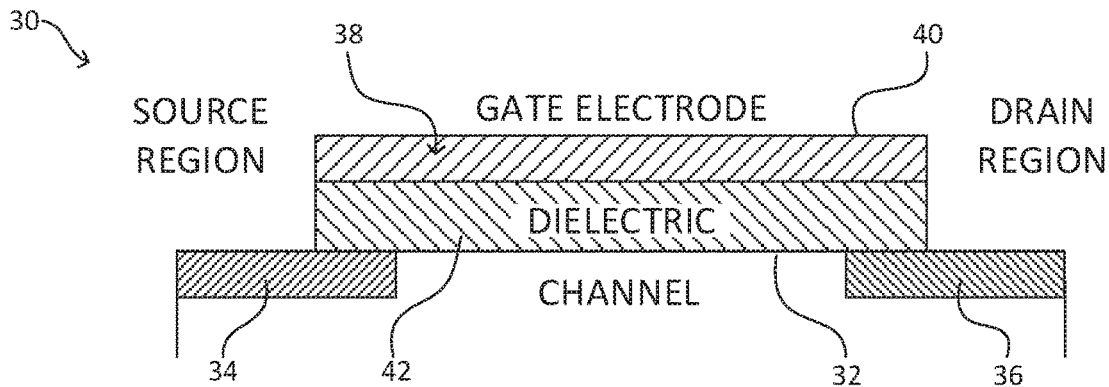
FIG. 1 shows a schematic illustration of a tunneling field effect transistor including a III-N source region.

FIG. 1 provides a schematic illustration of an exemplary tunneling field-effect transistor 30. The transistor 30 includes a channel region 32 and source and drain regions 34, 36. The channel region 32 and drain region are p-type in this exemplary embodiment. In p-type semiconductors, holes are the majority carriers. In contrast, "n-type" conductivity typically involves the addition of impurities that contribute free electrons to an intrinsic semiconductor. In a silicon containing substrate, examples of p-type dopants, i.e.

impurities, include but are not limited to group III materials such as boron, aluminum, gallium and indium. The p-type channel region 32 can be formed during fabrication of a semiconductor-on-insulator (SOI) wafer in some embodiments. Ion implantation can alternatively be employed following substrate wafer fabrication to form the doped channel and drain regions. The doping concentration of the channel region 32 is between $10^{15}$ to $10^{19}$ cm$^{-3}$ in one or more embodiments. In embodiments wherein the channel region 32 and source and drain regions are formed using the semiconductor layer (SOI layer) of a SOI substrate, an electrically insulating layer (not shown) is present beneath the semiconductor layer. In one exemplary embodiment, the electrically insulating layer is a high quality silicon dioxide layer (not shown) that is thermally grown, though other buried insulators such as boron nitride (BN) and aluminum oxide ($Al_2O_3$) may alternatively be employed in some embodiments. High quality buried oxides are generally characterized by relatively low interface trap densities ($D_{it}$). The thickness of the semiconductor layer from which the channel region 32 is formed is between 20 nm-1 µm in exemplary embodiments, but thicker or thinner layers may be usable in some applications. Exemplary single crystal materials for the semiconductor layer used to form the channel region 32 include silicon and silicon-containing films such as silicon germanium (SGOI). The semiconductor layer is pure germanium (GOI) in other embodiments. Typically, SiGe is formed from Si substrates as SiGe substrates are not readily obtained from commercial suppliers. The electrically insulating layer (not shown) in an exemplary embodiment is between 5-200 nm, but may also be thicker or thinner for some applications. In some embodiments, a bulk substrate can include quartz or other materials as opposed to silicon. The semiconductor-on-insulator substrates may be produced using techniques known in the art.

A monocrystalline silicon substrate can be processed using known device fabrication processes to form the relatively heavily doped drain region 36 in the semiconductor layer. In one or more exemplary embodiments, boron doping (greater than $1\times10^{18}$ cm$^{-3}$) may be provided at selected areas of the substrate during fabrication of an SOI wafer to form drain regions for tunneling field effect transistors formed thereon. Ion implantation conducted through a patterned mask can be employed to form each doped drain region 36. The drain region 36 is between a few nanometers to one micron in depth in a monocrystalline silicon layer in one or more embodiments and is more heavily doped than the adjoining channel region, therefore having higher (p-type) conductivity. Alternatively, the drain region 36 can be formed from materials that are different from those employed to form the channel region 32. If the drain region is grown on the substrate rather than formed via implantation of acceptor atoms, the appropriate impurities can be incorporated within the drain region during deposition.

The source region 34 of the transistor 30 is an n-type III-N material. In one or more exemplary embodiments, the III-N material is InGaN. In other embodiments, the III-N material is GaN. AlGaN is a further alternative, but thickness optimization is required as it has a higher bandgap than InGaN. As discussed below, InGaN is well suited for use in TFETs as described herein by employing selected molar fractions of indium and gallium. The electron affinity of the III-N material is greater than the hole affinity of the channel material (Si, SiGe, or Ge) of the transistor. The term "hole affinity" is defined as the sum of electron affinity and bandgap. Electron affinity is the energy obtained by moving an electron from a vacuum just outside a semiconductor to the bottom of the conduction band just inside the semiconductor. The source material has n-type conductivity. A broken-band heterojunction is formed between the source and channel regions. It will be appreciated that multiple TFETs as well as other types of transistors are optionally formed on the same substrate. Such devices would be physically isolated during the fabrication process. Device isolation is obtained by a selective etch of the semiconductor layer from which the channel region and, in some embodiments, the drain region of the TFET is formed. Electrically conductive contacts (not shown) are formed on the source and drain regions in one or more embodiments.

A gate stack 38 includes a gate electrode 40 and a gate dielectric layer 42. Materials such as silicon dioxide or high-k materials such as $HfO_2$ or $Al_2O_3$ can be employed as gate dielectric layers. The gate dielectric layer can, in some embodiments, comprise layers of both high-k and low-k dielectric materials. Gate electrodes can be deposited by PVD, ALD, CVD or other processes known to those of skill in the art. The gate electrodes may be comprised of metals such as TiN, TaN, Al, W Au, Ag, or a combination of such metals. Gate electrode layers may also include a polysilicon layer located on top of a metal material, whereby the top of the polysilicon layer may be silicided. Metal electrodes (not shown) forming source and drain contacts are deposited on the elements shown in FIG. 1. The deposition of the gate dielectric layer and gate electrodes can be conducted in the same manner such elements are formed in conventional MOSFET fabrication techniques. While the gate stack is shown overlapping a portion of the source region 34, such overlap is optional and not required.

Figure 2A:
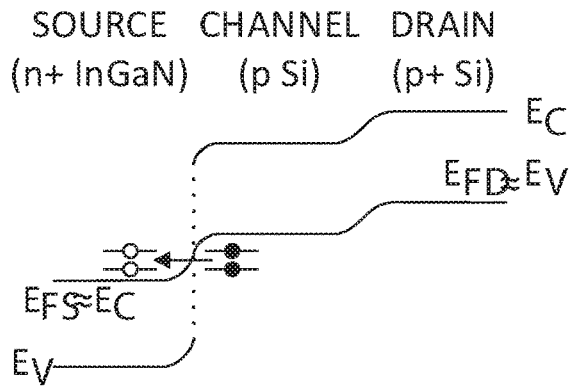
FIGS. 2A and 2B show schematic energy band diagrams illustrating band states resulting from negative and positive gate voltage, respectively, of a InGaN/Si tunneling field-effect transistor.
Figure 2B:
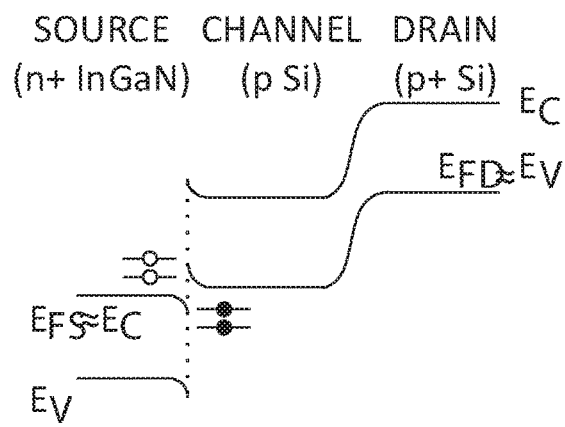

Operation of a tunneling field-effect transistor 30 as described above is illustrated schematically by the energy band diagrams shown in FIGS. 2A and 2B. Referring first to FIG. 2A, the valence, Fermi, and conduction bands of the n+ InGaN source region, p Si channel region, and p+ Si drain region are shown upon the application of a sufficient negative gate voltage to cause an ON state of the transistor. The full valence band states in the channel region are in alignment with empty conduction band states in the source region, thereby allowing electron tunneling. Upon application of a positive gate voltage, the full valence band states in the channel region are out of alignment with empty conduction band states in the source region, as shown in FIG. 2B. The TFET is accordingly in an OFF state.

Figure 3A:
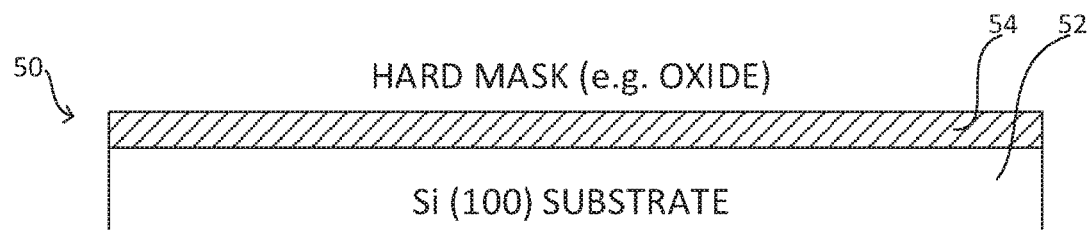
FIGS. 3A-3D show a sequence of steps used in fabricating a tunneling field effect transistor using a silicon substrate.
Figure 3B:
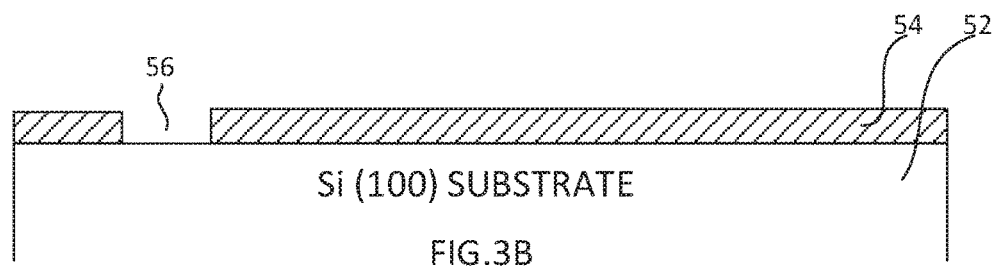
Figure 3C:
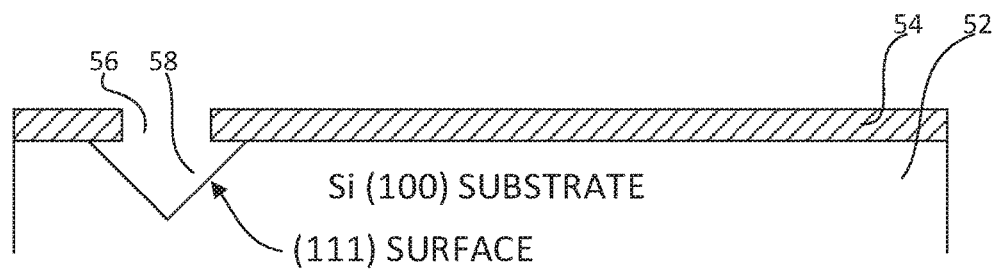
Figure 3D:
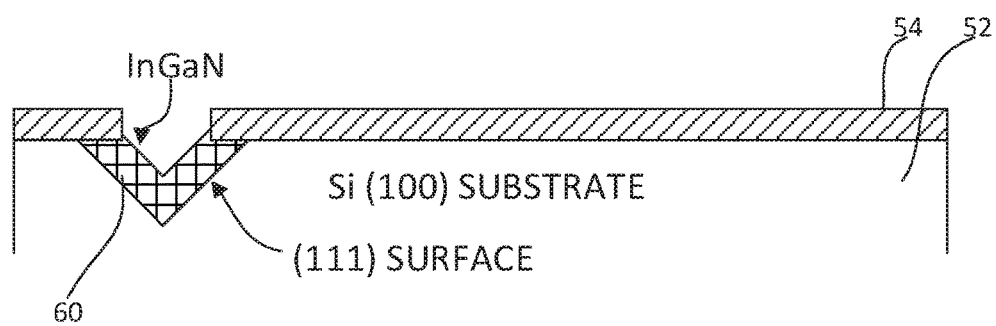

FIGS. 3A-D show exemplary process steps that are employed in one or more embodiments for forming a III-N source region of a tunneling field-effect transistor. A structure 50 including a monocrystalline silicon (100) substrate 52 and a hard mask 54 is obtained. Such a structure is obtained in one embodiment by forming the mask 54 on the substrate, as shown in FIG. 3A. In one or more exemplary embodiments, the hard mask is an oxide layer such as silicon dioxide. The hard mask may be formed via plasma enhanced chemical vapor deposition (PECVD). The hard mask 54 is patterned using conventional technology (e.g. photolithographic and etching techniques) to form an opening 56 that extends to the silicon substrate, as shown in FIG. 3B. This may include steps of forming a photoresist layer on the oxide surface layer of a wafer, for example by spin coating, exposing the photoresist to a light source through a mask and developing the photoresist as known in the art; subsequent etching of the mask 54, for example by a reactive ion etching (RIE) process to form the opening(s) 56, is followed by stripping the photoresist, for example by a plasma ashing process. It will be appreciated that multiple openings can be formed in the hard mask 54 to be used for the later forming of III-N source regions for an array of TFETs or for other purposes. Buffered hydrofluoric acid is among the materials that can be used to etch silicon dioxide, though selective, plasma-based etching (ME) is preferred for enhanced controllability. The area(s) of the silicon substrate 52 exposed by the opening(s) 56 in the mask 54 is etched anisotropically using an alkaline solution such as KOH or $K_2CO_3$. Other wet etchants may also be feasible. As silicon etches more rapidly in <100> crystal directions than in <111> directions, the etching of a silicon (100) surface through the opening 56 in the mask 54 produces a recess 58 having a V-shaped cross-section as schematically illustrated in FIG. 3C. The anisotropic etching step can be discontinued prior to completion, in which case the recess would have a flat bottom (not shown). A layer 60 of III-N source material such as $In_yGa_{1-y}N$ is grown epitaxially on the exposed surfaces of the substrate 52 within the recess 58. The layer 60 has a thickness in the range of 20 nm to 1 μm. In embodiments wherein the recess 58 has a V-shaped cross section as shown in FIG. 3D, the III-N layer 60 is grown on the (111) surfaces exposed by a complete anisotropic etch. The crystalline quality of the III-N layer is not considered critical to TFET operation. The growth of the InGaN layer is facilitated by the formation of the etch front in the previous step. In some embodiments, growth of InGaN source material is conducted in a MOCVD reactor. Source materials in one or more embodiments include trimethylgallium (TMGa), trimethylindium (TMIn) and ammonia ($NH_3$). Disilane ($Si_2H_6$) is an n-type dopant employed to obtain the n-type conductivity desired for the layer 60 of InGaN source material. A temperature range of 810-830° C. is maintained during deposition at a pressure of about 350 torr. An InGaN:Si layer 60 obtained in one or more embodiments has a doping level of $1 \times 10^{19}$ $cm^{-3}$ or higher. In embodiments including monocrystalline silicon channel regions, the indium content should be at least forty-six percent ($In_{0.46}Ga_{0.54}N$).

Figure 4A:
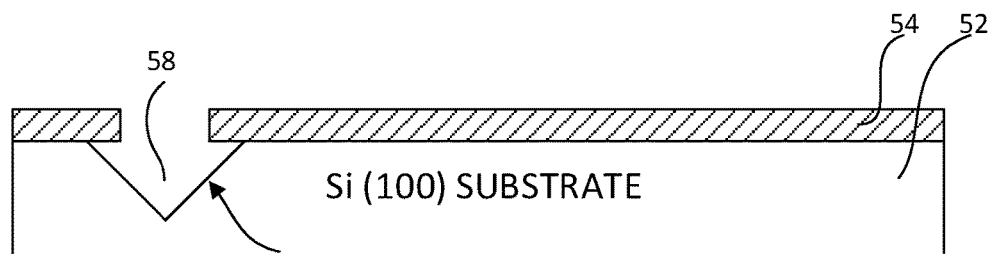
FIGS. 4A-4B show a further sequence of steps used in fabricating a tunneling field effect transistor including a silicon germanium substrate.
Figure 4B:
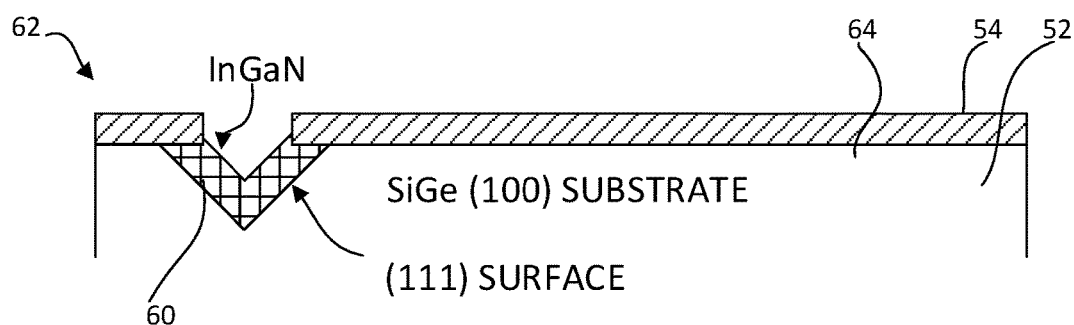

FIGS. 4A and 4B schematically illustrate alternative method steps that can be used in fabricating a TFET. Referring to FIG. 4A, a structure as shown in FIG. 3C is obtained by etching the substrate anisotropically as described above. Germanium is implanted to a depth of a few nanometers (e.g. 3-5 nm) to tens of nanometers into the silicon substrate, forming a silicon germanium ($Si_xGe_{1-x}$) region 64. A patterned photoresist layer can be employed to protect selected areas of the substrate from germanium implantation. As known in the art, ion implantation process parameters such as ion beam energy, implantation dose and tilt angles are selected to obtain regions of desired dimensions and compositions. In an exemplary embodiment, ion beam energy is 10-80 KeV and the tilt is 0-7 degrees. The doping concentration obtained in the exemplary embodiment is $2 \times 10^{13}$-$2 \times 10^{15}$ $cm^{-3}$. A silicon germanium channel region is obtained following germanium implantation by solid phase epitaxial regrowth. Such regrowth may be performed at a temperature between about 450-700° C. for approximately ten minutes. Lattice mismatch between the silicon germanium channel region and the adjoining silicon substrate can be reduced in this manner. Germanium implantation is followed by the epitaxial growth of the III-N layer 60 such as an InGaN layer within the recess(es) 58 to form the structure 62 shown in FIG. 4B. The hard mask 54 may or may not be removed prior to germanium implantation or prior to III-N epitaxy. The implantation of germanium in the substrate allows a lower indium content where InGaN is the III-N material used to form the source region of the TFET. In embodiments employing a silicon substrate, the molar fraction of indium required to obtain a broken-band heterojunction is about forty-six percent ($In_{0.46}Ga_{0.54}N$). In contrast, the indium content of the III-N layer 60 can be less than forty-six percent in embodiments including a silicon germanium substrate. A molar fraction of about twenty-five to forty-six percent indium can be employed in embodiments including an InGaN source region and a silicon germanium channel region. As indium is a relatively volatile element that can result in an unstable growth surface, the reduction of indium content within the source region facilitates the fabrication of the TFET.

Once the III-N source region has been formed within the substrate as described above with respect to FIGS. 3A-D or 4A-B, further fabrication steps are employed to form the doped regions that comprise the channel and drain regions and the gate stack of the TFET. The remaining fabrication process can proceed in the same manner as conventional industrial MOSFET fabrication. Forming the source region as described above enables conventional fabrication without having to depart from standard process flow for the remaining elements of the transistor. The oxide material used to form the hard mask 54 is preferably removed prior to formation of the gate stack rather than used as gate dielectric material.

Figure 5:
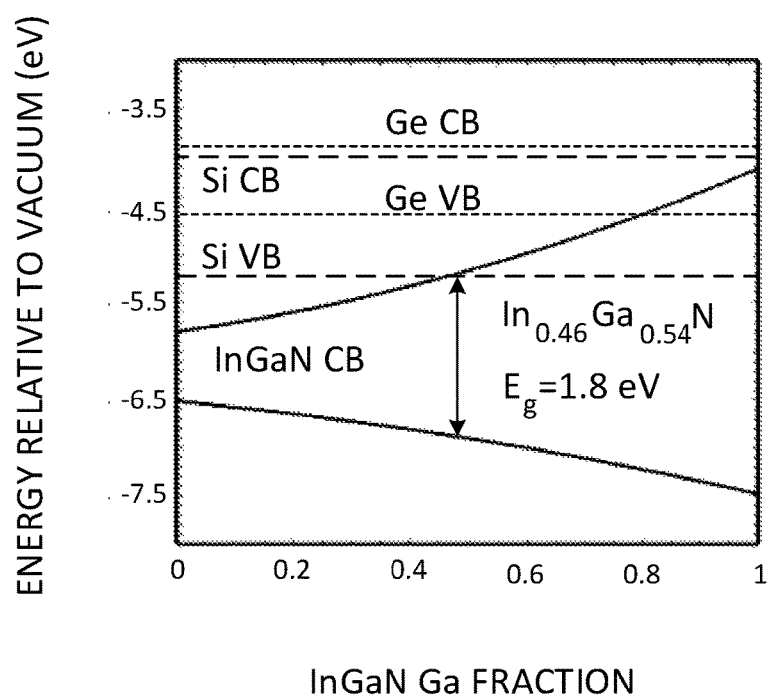
FIG. 5 is a graph showing energy relative to vacuum as a function of InGaN Ga fraction and the conduction and valence bands of silicon and germanium.

FIG. 5 shows the energy (eV) relative to vacuum of InGaN, an exemplary III-N material, as a function of the gallium fraction of InGaN. The valence and conduction bands of pure crystalline silicon and germanium are also shown. The band gap in electron volts of $In_{0.46}Ga_{0.54}N$ is about 1.8 eV. The conduction band of $In_{0.46}Ga_{0.54}N$ intersects the valence band of silicon to obtain a broken-band heterojunction when such materials are employed in a TFET. The conduction band of InGaN intersects the valence band of germanium at a substantially lower percentage of indium (and higher percentage of gallium). As discussed above, the incorporation of germanium within a silicon substrate allows the reduction of the indium content in embodiments where InGaN is used as the source material for a TFET and forms a p-n junction with a silicon-containing channel region. The extent to which the indium content can be reduced correlates to the amount of germanium within a $Si_xGe_{1-x}$ channel.

The principles relating to the use of a broken band heterojunction between a n-type III-N source material and a p-type $Si_xGe_{1-x}$ channel material are applicable to tunneling field-effect transistors having a variety of physical configurations including but not limited to FinFET transistors, raised source/drain transistors and gate all-around (GAA) transistors.

Given the discussion thus far and with reference to the exemplary embodiments discussed above and the drawings, it will be appreciated that, in general terms, an exemplary tunneling field-effect transistor is provided that includes a a source region comprised of an epitaxial n-type III-N material, a p-type drain region, and a p-type $Si_xGe_{1-x}$ channel region operatively associated with the source and drain regions, wherein x is between 0 and 1. An exemplary transistor 30 having a III-N source region 34, a p-type drain region 36, and a p-type $Si_xGe_{1-x}$ channel region 32 is shown in FIG. 1. The n-type, III-N material has an electron affinity larger than the hole affinity of the channel region. The transistor further includes a gate electrode and a gate dielectric layer between the gate electrode and the channel region. In one or more embodiments, the channel region contains germanium. In other embodiments, the channel region consists essentially of monocrystalline silicon containing no germanium. Impurity atoms within the channel region provide p-type conductivity in embodiments having silicon as well as silicon germanium channels. The III-N source material comprises InGaN in one or more embodiments. In embodiments wherein the channel region contains germanium, lower levels of indium are possible while still achieving a broken-band heterojunction. FIG. 5 is illustrative of the proportions of indium and gallium required to obtain broken-band source-channel heterojunctions in embodiments where the III-N material is InGaN and the channel region comprises silicon and/or germanium. In some embodiments, the source region of the TFET consists essentially of n-type $In_yGa_{1-y}N$ having a doping level of $1\times10^{19}$ cm$^{-3}$ or higher, the channel region consists essentially of crystalline $Si_xGe_{1-x}$ wherein x is less than one and further wherein y is less than 0.46.

An exemplary method of fabricating a tunneling field-effect transistor includes obtaining a crystalline $Si_xGe_{1-x}$ substrate, wherein x is between 0 and 1, the crystalline $Si_xGe_{1-x}$ substrate having a top surface and a mask adjoining the top surface. The mask is patterned to form one or more openings within the mask. One or more recesses are anisotropically etched within the top surface of the substrate. The recesses are aligned with the openings in the mask, such as shown in FIG. 3C. A III-N source region having n-type conductivity is grown epitaxially on the substrate within the one or more recesses. FIG. 3D schematically illustrates the growth of the III-N source region. The mask is removed. A channel region having p-type conductivity is formed from the substrate, a broken-band heterojunction being formed between the source region and the channel region. A drain region having p-type conductivity and operatively associated with the channel region is formed. The method further includes forming a gate dielectric layer on the substrate and adjoining the channel region and forming a gate electrode over the gate dielectric layer. In one or more embodiments, germanium is implanted within a silicon substrate. As discussed above, such implantation allows the indium content of the source region to be reduced in comparison to TFETs fabricated with channel regions consisting essentially of monocrystalline silicon.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Terms such as "above", "below", "top" and "bottom" are generally employed to indicate relative positions as opposed to relative elevations unless otherwise indicated. It should also be noted that, in some alternative implementations, the steps of the exemplary methods may occur out of the order noted in the figures. For example, two steps shown in succession may, in fact, be executed substantially concurrently, or certain steps may sometimes be executed in the reverse order, depending upon the functionality involved.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A tunneling field-effect transistor comprising:
    a crystalline $Si_xGe_{1-x}$ substrate;
    a source region comprised of an epitaxial n-type III-N material;
    a p-type drain region;
    a p-type $Si_xGe_{1-x}$ channel region comprised of a portion of the crystalline $Si_xGe_{1-x}$ substrate, the channel region being operatively associated with the source and drain regions and forming a broken-band heterojunction with the source region, wherein x is 0, 1, or between 0 and 1, the n-type, III-N material has an electron affinity larger than the hole affinity of the channel region, and the drain region has a higher p-type conductivity than the channel region;
    a gate electrode, and
    a gate dielectric layer between the gate electrode and the channel region.

2. The tunneling field-effect transistor of claim 1, wherein the III-N material includes InGaN.

3. The tunneling field-effect transistor of claim 1, wherein the drain region is comprised of a portion of the crystalline $Si_xGe_{1-x}$ substrate, the channel region having a first doping level between $10^{15}$ to $10^{19}$ cm$^{-3}$.

4. The tunneling field-effect transistor of claim 1, wherein the gate dielectric layer overlaps the source region.

5. The tunneling field-effect transistor of claim 1, wherein the crystalline $Si_xGe_{1-x}$ substrate includes a recess including a (111) surface, the source region adjoining the (111) surface.

6. The tunneling field-effect transistor of claim 1, wherein x is less than one.

7. The tunneling field-effect transistor of claim 6, wherein x is greater than zero.

8. The tunneling field-effect transistor of claim 1 wherein the source region consists essentially of $In_yGa_{1-y}N$ having a doping level of $1\times10^{19}$ cm$^{-3}$ or higher.

9. The tunneling field-effect transistor of claim 8 wherein the channel region consists essentially of crystalline $Si_xGe_{1-x}$ wherein x is less than one, and further wherein y is less than 0.46.

10. The tunneling field-effect transistor of claim 9, wherein the crystalline $Si_xGe_{1-x}$ substrate includes a recess having (111) surfaces, the source region comprising an epitaxial layer on the (111) surfaces having a thickness between 20 nm and 1 μm.

11. A tunneling field-effect transistor comprising:
    an n-type source region consisting essentially of $In_yGa_{1-y}N$ having a doping level of $1\times10^{19}$ cm$^{-3}$ or higher, wherein y is less than 0.46;
    a p-type drain region;
    a p-type channel region consisting essentially of crystalline $Si_xGe_{1-x}$ wherein x is less than one, the channel region being operatively associated with the source and drain regions and forming a broken-band heterojunction with the source region, the source region having an electron affinity larger than the hole affinity of the channel region, and the drain region having a higher p-type conductivity than the channel region;
    a gate electrode, and
    a gate dielectric layer between the gate electrode and the channel region.

12. A tunneling field-effect transistor comprising:

an n-type source region consisting essentially of $In_yGa_{1-y}N$ wherein y is about 0.46;

a p-type drain region;

a p-type channel region consisting essentially of crystalline silicon, the channel region being operatively associated with the source and drain regions and forming a broken-band heterojunction with the source region, the source region having an electron affinity larger than the hole affinity of the channel region, and the drain region having a higher p-type conductivity than the channel region;

a gate electrode, and a gate dielectric layer between the gate electrode and the channel region.

13. The tunneling field-effect transistor of claim 12, wherein the crystalline silicon substrate includes a recess including (111) surface, the source region adjoining the (111) surface.

\* \* \* \* \*